United States Patent
Tobescu et al.

(10) Patent No.: US 7,057,965 B2
(45) Date of Patent: Jun. 6, 2006

(54) METHOD OF PERFORMING ACCESS TO A SINGLE-PORT MEMORY DEVICE, MEMORY ACCESS DEVICE, INTEGRATED CIRCUIT DEVICE AND METHOD OF USE OF AN INTEGRATED CIRCUIT DEVICE

(75) Inventors: Corneliu Tobescu, Zürich (CH); Antonius Petrus Gerardus Welbers, Malters (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 91 days.

(21) Appl. No.: 10/512,031

(22) PCT Filed: Apr. 14, 2003

(86) PCT No.: PCT/IB03/01445

§ 371 (c)(1),
(2), (4) Date: Oct. 19, 2004

(87) PCT Pub. No.: WO03/090231

PCT Pub. Date: Oct. 30, 2003

(65) Prior Publication Data

US 2005/0180254 A1    Aug. 18, 2005

(30) Foreign Application Priority Data

Apr. 22, 2002  (EP) .................... 02008927

(51) Int. Cl.
*C11C 8/00* (2006.01)
(52) U.S. Cl. .................... 365/233; 365/189.01
(58) Field of Classification Search ................ 365/233, 365/189.01, 194; 711/100, 105
See application file for complete search history.

(56) References Cited

U.S. PATENT DOCUMENTS

| | | | | |
|---|---|---|---|---|
| 5,659,687 A | * | 8/1997 | Kim et al. .................. | 710/112 |
| 6,370,037 B1 | * | 4/2002 | Schoenfish .................. | 361/807 |
| 2004/0228199 A1 | * | 11/2004 | Oda ........................... | 365/232 |

* cited by examiner

*Primary Examiner*—Vu A. Le
(74) *Attorney, Agent, or Firm*—Kevin Fortin

(57) ABSTRACT

An arbiter 15 for accessing a single-port RAM 13 without the need to use a hand-shaking protocol is proposed. This allows simultaneous read and write accesses to a single-port RAM 13. All write accesses are delayed so that the arbiter 15 can detect if there is a simultaneous read access. If there is a read access, the read access is delayed until the write access is completed.

19 Claims, 4 Drawing Sheets

Figure 1:
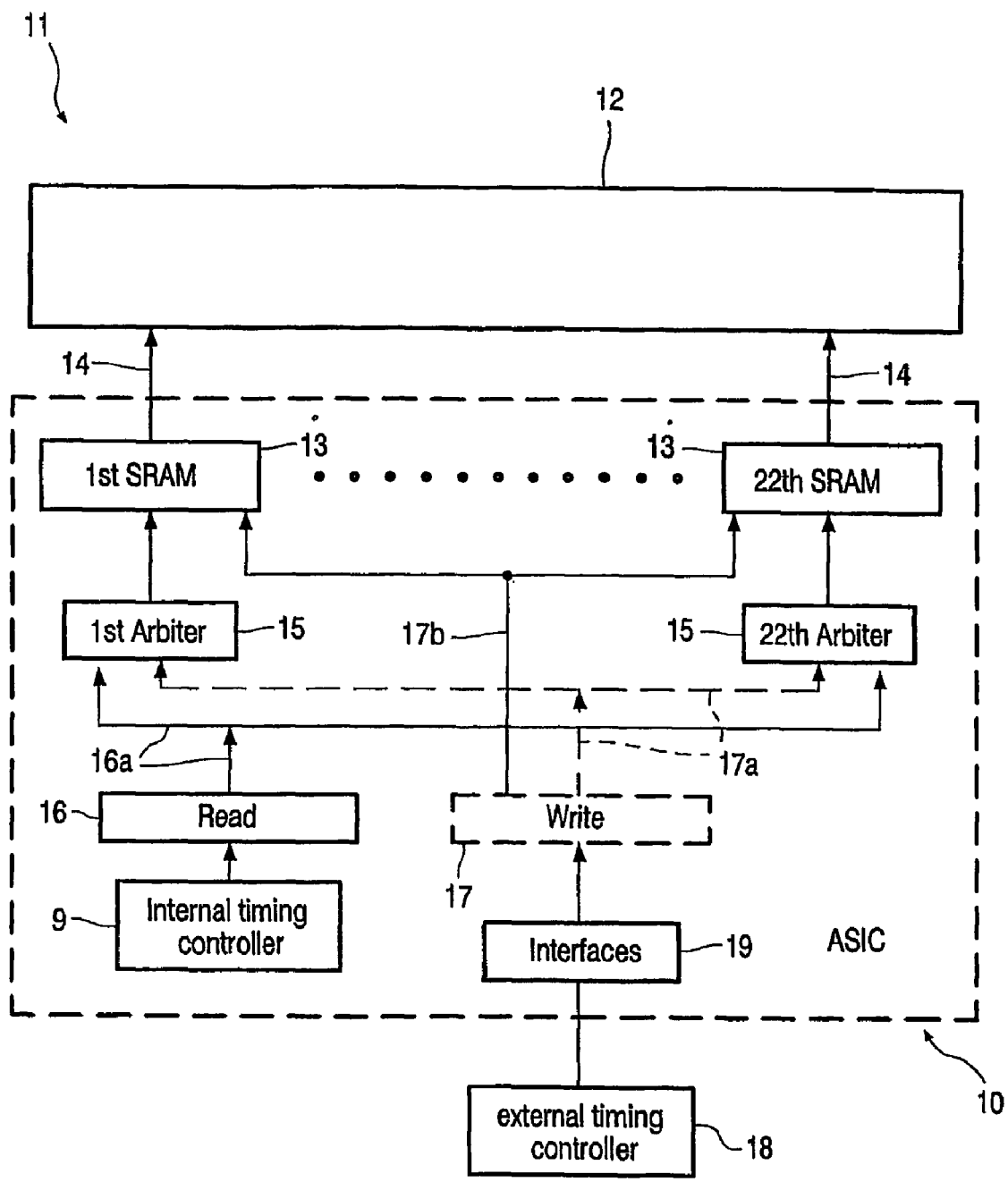

METHOD OF PERFORMING ACCESS TO A SINGLE-PORT MEMORY DEVICE, MEMORY ACCESS DEVICE, INTEGRATED CIRCUIT DEVICE AND METHOD OF USE OF AN INTEGRATED CIRCUIT DEVICE

The invention relates to a method of performing access to a single-port memory device. Further the invention relates to a memory access device and an integrated circuit device and a method of use of an integrated circuit device.

Random access memory devices (RAM) in general are available as static random access memories (SRAM) or dynamic random access memories (DRAM). The main difference is, that the latter need a refresh cycle when in an operating modus.

For most applications having high processing speed demands a dynamic random access memory (DRAM) is a good choice to achieve high processing performance and also a high package and integration density. A DRAM cell is typically of smaller size as compared to other known memory cells and thus allows a high package density. The amount of DRAM cells which can be packed in principle into a unit area of a wafer or chip exceeds the amount achievable with other memory cells. Dual-port DRAMs and single-port DRAMs are available.

Still a DRAM cell generally is slower in processing speed than other memory cells. Such disadvantage can partially be cancelled by using a dual-port DRAM in order to reduce access time to the DRAM and thereby increasing processing performance of a DRAM-based device. Since processes of different kind, which are typically not synchronized, may access a DRAM device independently, the processing speed is significantly increased for a dual-port DRAM. Care has to be taken only for those cases in which different processes on different ports of a dual-port DRAM within the same clock cycle access the same address of a dual-port DRAM device. For such purpose, i.e. in cases of simultaneous access requests for the same address on both ports within the same clock cycle, a control circuit is usually implemented to control access to a dual-port DRAM. Measures of such kind are described for instance in U.S. Pat. No. 6,078,527 with regard to an arbitration circuit used for a dual-port DRAM or in U.S. Pat. No. 5,781,480 with regard to an address collision detector used for a dual-port DRAM. The teaching of the referenced prior art implies, that a match signal is generated by the control circuit to determine which port receives priority upon a colliding access request. However, such kind of decision is taken case by case according to the specific demands of DRAM having two ports, i.e. a dual-port DRAM. The match signal is generated without taking into a account the particular kind of an access request. The priority decision is taken independent of the kind of access request.

Still there are some significant disadvantages of dual-port DRAMs, in particular concerning specific applications of a RAM for example in application specific integrated circuits (ASICs). With regard to area and power consumption, a single-port RAM, which may be a DRAM or a SRAM, is particular useful for some applications in ASICs and most specifically is needed to be built on the chip. The power consumption of a single-port RAM may be up to ten times lower due to lower currents than in a dual-port RAM. Further a dual-port RAM necessitates up to twice as many RAM cells as a single-port RAM and thus may entail a significant increase of area consumption on chip, increase of cost and high demands of circuit design.

The only disadvantage of a single-port RAM is that it does not allow generally simultaneous accesses of not synchronized processes at the same time. Whereas a collision of not synchronized processes in a dual-port RAM usually may occur only when access is requested within the same clock cycle and to the same address, simultaneous access of not synchronized processes to a single-port RAM have to be controlled in general. Therefore, for single-port RAMs, some extra circuitry is needed for signal decoding and collision detection of not synchronized processes accessing the single-port RAM. In particular, to be able to use a single-port RAM and since a write- and read-access are controlled by two different processes that are not synchronized together, it is necessary that an arbiter takes care that a RAM access happens in a correct way without loosing data. Consequently, the extra circuitry necessary for a single-port RAM is substantially different from the one needed for a dual-port RAM due to the reasons outlined above.

In the U.S. Pat. No. 6,259,634 B1, a single-port 1-T DRAM (one transistor DRAM) works with a modified design of a read sense amplifier to perform both, read- and write-accesses, within a single clock cycle. Hence a pseudo dual-port 1-T DRAM is constituted, that emulates a dual-port DRAM. For this purpose still two lines, a read global bit line and a write global bit line, are coupled to the read sense amplifier to perform both, read- and write-accesses, effectively within one single clock cycle. Such solution still relies on a clock cycle usually working at high clock rates and therefore still has a comparatively high energy consumption. Further such solution in effect still relies on the principle of a dual-port DRAM having two lines to guarantee simultaneous accesses to the DRAM independent of the kind of access.

In the U.S. Pat. No. 6,144,604 a single-port RAM device is described also working with one single clock cycle. Wherein a "first in/first out" (FIFO) buffer is used in case of a collision of an input and an output access. Upon collision, one of the input and output words is passed between the respective port of the memory device and the FIFO buffer. Also independent of the kind of access, whether read or write, an access request is delayed in the FIFO buffer. Consequently read and write processes are performed at the same common clock rate.

In the U.S. Pat. No. 5,706,482 an arbiter section is provided for arbitrating concurrence between write requests and read requests to a single-port RAM. The arbiter section supplies a write buffer for write requests and a read buffer for read requests in case of a collision of write and read requests. Such concept relies on intermediate buffering of data and aims to guarantee a continuous flow of data to and from a write/read buffer instead of allowing direct access to the single-port RAM. Arbitration is performed case by case in consideration of the concurrence of write and read requests, however, still independent of the kind of requests. Similar to the concept outlined in U.S. Pat. No. 6,144,604, the concept of U.S. Pat. No. 5,706,482 relies on a "first in/first out" rule and determines priority of an access request case by case solely with regard to timing demands. Priority decisions are taken independent of whether the request is a write request or a read request.

Therefore, the teachings of all referenced prior art have a major disadvantage in general. They describe an arbiter that works on a "request/acknowledge principle" and therefore necessitates for a so-called "handshaking protocol". Such principle also uses a single and fast external clock rate. Such clock rate is used to sample the request and to generate the acknowledge when the arbiter allows to one process to do an access on the RAM. The use of handshaking protocols however, is deficient for processing speed and therefore needs for a faster clock in the range of some MHz. For instance a two-times faster clock could mean in general also up to a double power consumption. Such principle of arbiter is in particular not qualified for ASICs where power consumption is a major item.

This is where the invention comes in, the object of which is to specify a method for performing access to a single-port memory device, an apparatus adapted to execute such method and a method of use of such apparatus, in which access to the single-port memory device is controlled in an effective way such that a collision of simultaneous accesses and loss of data are prevented.

Regarding the method, the object is solved by a method of performing access to a single-port memory device wherein in accordance with the invention, the following steps are comprised:

providing a memory access device to control the access, processing a first access-signal of high priority at a first clock rate, processing a second access-signal of low priority at a second clock rate, wherein the first clock rate exceeds the second clock rate, providing direct access to the memory device for the first access-signal of high priority, and properly delaying the first access-signal of high priority to generate an access-timing according to the demands of the memory device.

Direct access to the memory device for the first access-signal of high priority may be established of course also if the access-signal of high priority accesses the memory device without being processed in the memory access device. As a concept of the invention also for those first access-signals of high priority, which are processed in the memory access device, a direct access to the memory device is provided, i.e. those first access-signals of high priority are pipelined through the memory access device directly to the memory device. In particular, no "handshaking protocol" or request/acknowledge concept is necessary to provide direct access to the memory device for the first access-signal of high priority.

As no request/acknowledge is necessary according to the proposed method, the first access-signal of high priority, although processed at a first clock rate exceeding the second clock rate, may be subsequently provided to the memory device at a slower rate. In particular, the access-signal of high priority is properly delayed to generate an access-timing according to the demands of the memory device. Further, processing of the second access-signal of low priority is generally performed at a second clock rate which falls below the first clock rate. These measures result in a reduction of power consumption and, as no request/acknowledge or "handshaking protocol" is needed, less efforts are necessary to control the access to the memory device. This advantageously supports an increase of processing efficiency.

Further, high priority is given to the first access-signal in general. In particular, such general high priority may be given to signals of complex processing demands whereas low priority is given to those access-signal of less complex processing demands.

Advantageously as a particular preferred configuration, the first access-signal of high priority is a write-signal, for instance a write-enable signal. As a further particular preferred configuration, the second access-signal of low priority is in particular a read-signal, e.g. a read-enable signal.

Methods known from prior art in the field of the invention usually rely on a decision regarding the priority of an access-signal case by case, and in particular rely on a first in/first out concept. The main concept of the proposed invention however gives high priority to a first access-signal in general to provide direct access to the memory device for the first access-signal of high priority, e.g. as outlined above for a write-signal, in particular a write-enable signal. Consequently, in any case the predetermined first access-signal of high priority is provided with direct access to the memory device, regardless of access requests of other access-signals. As according to the proposed method, a second access-signal of low priority is processed at a second clock rate falling below the first clock rate of the first access-signal of high priority, an access request of the second access-signal of low priority may be delayed or buffered any time a first access-signal of high priority is in preparation and/or in process. An access request of a first access-signal of high priority is sensed by the memory access device as the first access-signal of high priority is processed at a higher clock rate than the second access-signal of low priority, i.e. between two subsequent access requests of a second access-signal of low priority there is at least one access request of a first access-signal of high priority.

For access to the single-port memory device, the first access-signal of high priority is properly delayed to generate an access-timing according to the demands of the memory device. Therefore, according to the proposed method, in general access is made to the single-port memory device at a slow second clock rate falling below a fast first clock rate.

Thereby, a significant reduction of power consumption for a memory access device, a memory device, an integrated circuit device or some other module comprising a single-port memory device and a memory access device, is achieved. Such advantages become particular important for application specific integrated circuits (ASICs), specifically applications regarding display processing or display drivers.

Further, particular preferred configurations imply that the first and fast clock rate is an external clock rate, not implied by the memory access device and the second and slow clock rate is an internal clock rate of the memory access device. The internal clock rate may be supplied by the chip on which the memory access device is located on. The external clock rate may be supplied by some other chip different from the one on which the memory access device is located on. Still also the first and second clock rate may be both of an external kind or also may be both of an internal kind. A clock may be any kind of oscillator, processor or circuit or chip which is suitable to generate a respective clock rate.

Continued developed configurations of the proposed method are further outlined in the dependent method claims.

As a first access-signal of high priority, processed at a high first clock rate, is provided with direct access to the memory device, advantageously the second access-signal of low priority, is processed at a slow second clock rate, in general. In particular, access to the memory device for the access-signal of low priority is generally provided. Access is however not provided, in the case in which an access of a first access-signal of high priority is in preparation and/or in process. Such feature guarantees direct access to the memory device for the first access-signal of high priority.

Advantageously in the case that access to the memory device is not provided for the second access-signal of low priority the second access-signal is backed-up. For a backup the second access-signal of low priority may be buffered, delayed or stored by any suitable measure.

Advantageously, in the case that access to the memory device is not provided for the second access-signal of low priority, direct access to the memory device is made by the first access-signal of high priority. In particular, in such case after completion of an access to the memory device, by the first access-signal of high priority, access is made by the second access-signal of low priority. Advantageously, the completion of an access of the first access-signal of high priority is indicated by the trailing edge of the access signal or respective signal, indicating the completion. The same trailing edge is suitable to introduce the access of the second access-signal of low priority. Such feature allows particular simple processing.

To generate an access-timing according to the demands of the memory device, a proper delay of the first access-signal of high priority is preferably available from a number of delay periods offered for choice. In particular, a chain of resistance-capacitor elements or buffers is suitable for such purpose.

In a preferred configuration of the proposed method, the first external clock rate of the first access-signal of high priority and the second internal clock rate of the second access-signal of low priority are adapted such that a time gap in between two subsequent accesses of first access-signals of high priority is sufficiently wide to complete an access of a second access-signal of low priority therein. Such measure allows to introduce at least one access of a second access-signal of low priority after completion of an access of a first access-signal of high priority. Thereby, unwanted large amounts of delays of a second access-signal of low priority is avoided.

Regarding the apparatus, the object is solved by a memory access device for performing controlled access to a single-port memory device, wherein in accordance with the invention the following is comprised:

a first path for processing a first access-signal of high priority at a first clock rate, a second path-assembly for processing a second access-signal of low priority at a second clock rate, wherein the first clock rate exceeds the second clock rate, a control-assembly for providing direct access to the memory device for the first access-signal of high priority, a delay-assembly for properly delaying the first access-signal of high priority adapted to generate an access-timing according to the demands of the memory device.

A first or a second path is constituted as a number of elements, functionally connected to each other, in particular forming an assembly. Continued developed configurations of the proposed apparatus are further outlined on the dependent apparatus claims.

In particular, the first and/or second path comprises a number of control elements, in particular a logic gate and/or a flip-flop, functionally connected with each other and an input-interface and an output-interface.

Most advantageously at least the second path comprises a storage element to perform a backup function. Any suitable element may be used for back-up functions, e.g. a flip-flop.

The proposed memory access device, in particular, comprises a control-assembly, which advantageously comprises at least one input to receive a delay-assembly and/or access-addresses and an output-interface to transmit an access-signal and/or a RAM-select signal. Advantageously, such control assembly conducts a second access-signal of low priority to a second path, in case an access of a first access-signal of high priority is in preparation and/or in process to guarantee direct access to the memory device for the first access-signal of high priority. Consequently, as outlined above, at least the second path comprises a storage element for back up functions to be used for a second access-signal of low priority.

Preferably the first clock rate is an external clock rate and the second clock rate is an internal clock rate.

In particular, a memory access device as proposed may comprise only a single external clock rate input. Most advantageously, a write-enable-signal is provided at the single external clock rate input, whereas a read-enable signal is provided at the internal clock rate. Still also both clock rates may be external clock rates or both clock rates may be internal clock rates.

Further with regard to the apparatus, the object as solved by an integrated circuit device, wherein in accordance with the invention the following is comprised:

a single-port memory device, a means for supplying a first clock rate, a single clock rate input for supplying a second clock rate, and a memory access device as described above for accessing the single-port memory device.

It is to be noted that the first clock rate exceeds one second clock rate. In particular, the means for supplying a first clock rate comprises an internal timing controller. Furthermore, the single clock rate input supplies an external clock rate.

In a preferred configuration, the proposed integrated circuit device further comprises a number of single-port memory devices, each one of the number of single-port memory devices being addressable separately. Further, the proposed integrated circuit device may comprise a number of memory access devices, each one of the number of single-port memory devices being related to one of the number of memory access devices. In particular, the memory access devices of the number of memory access devices are all identical to each other.

In accordance with the invention, the proposed integrated circuit device is used as an application specific integrated circuit device, advantageously for accessing a display device or for use with regard to a display driver. Power consumption is a major advantage of such usage.

In summary, a method of performing access to a single-port memory device and a memory access device for performing controlled access to a single-port memory device, are proposed. The proposed method and apparatus allow accessing the single-port RAM without the need of a request/acknowledge or "handshaking protocol". The proposed inventive concept allows simultaneous reads and writes as with a dual-port RAM. A first access-signal of high priority, in particular a write-signal, is delayed to generate an access timing according to the demands of the memory device. Also such delay gives time to detect whether a simultaneous access request of a second access-signal of low priority is pending.

According to a preferred configuration of the proposed inventive concept, an access is generally provided for a second access-signal of low priority, except in the case that an access of a first access-signal of high priority is in preparation and/or in process. In such case, the second access-signal of low priority is backed up until the compression of the access of the first access-signal of high priority is completed.

Figure 2:
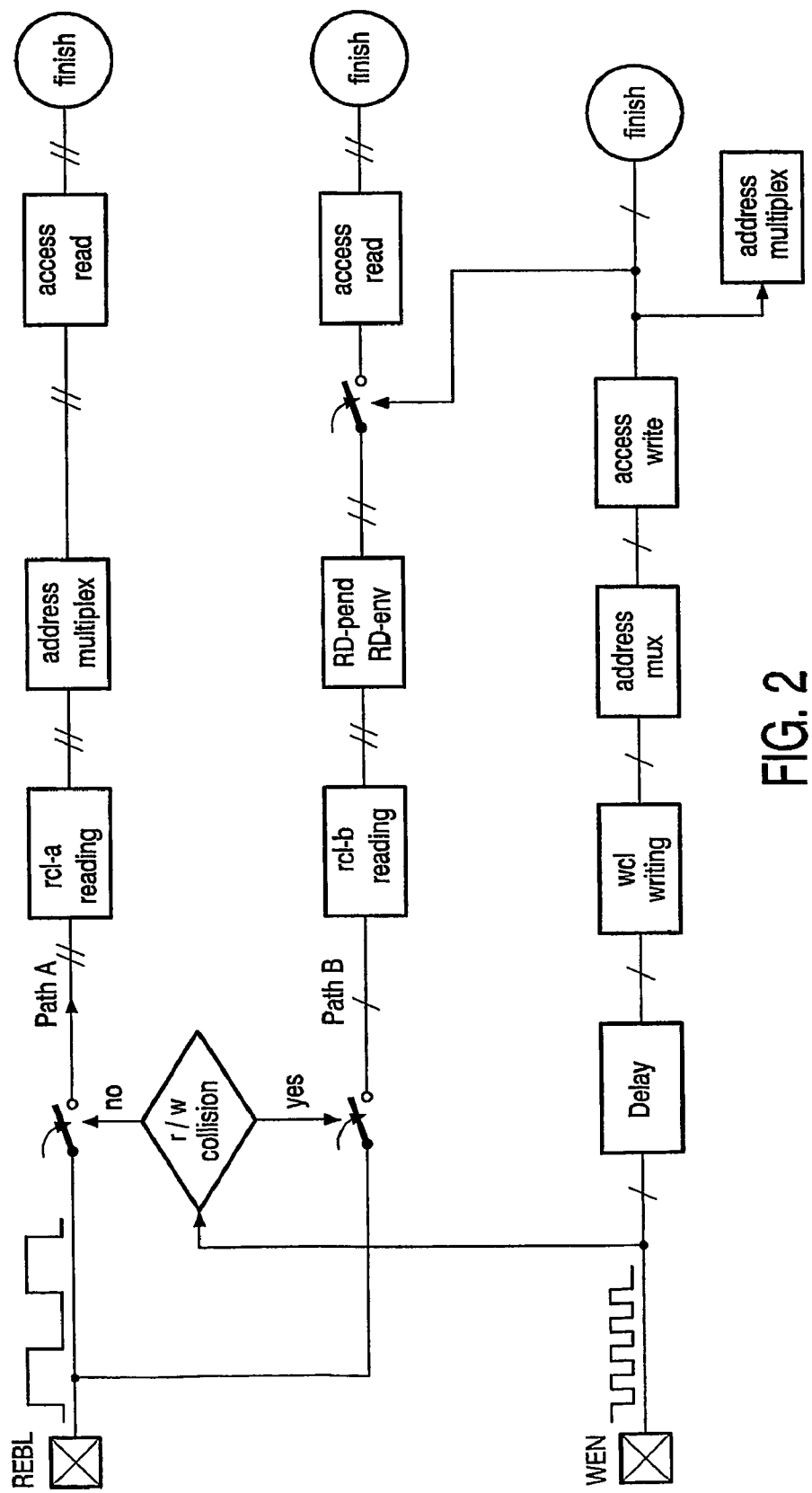
Figure 3:
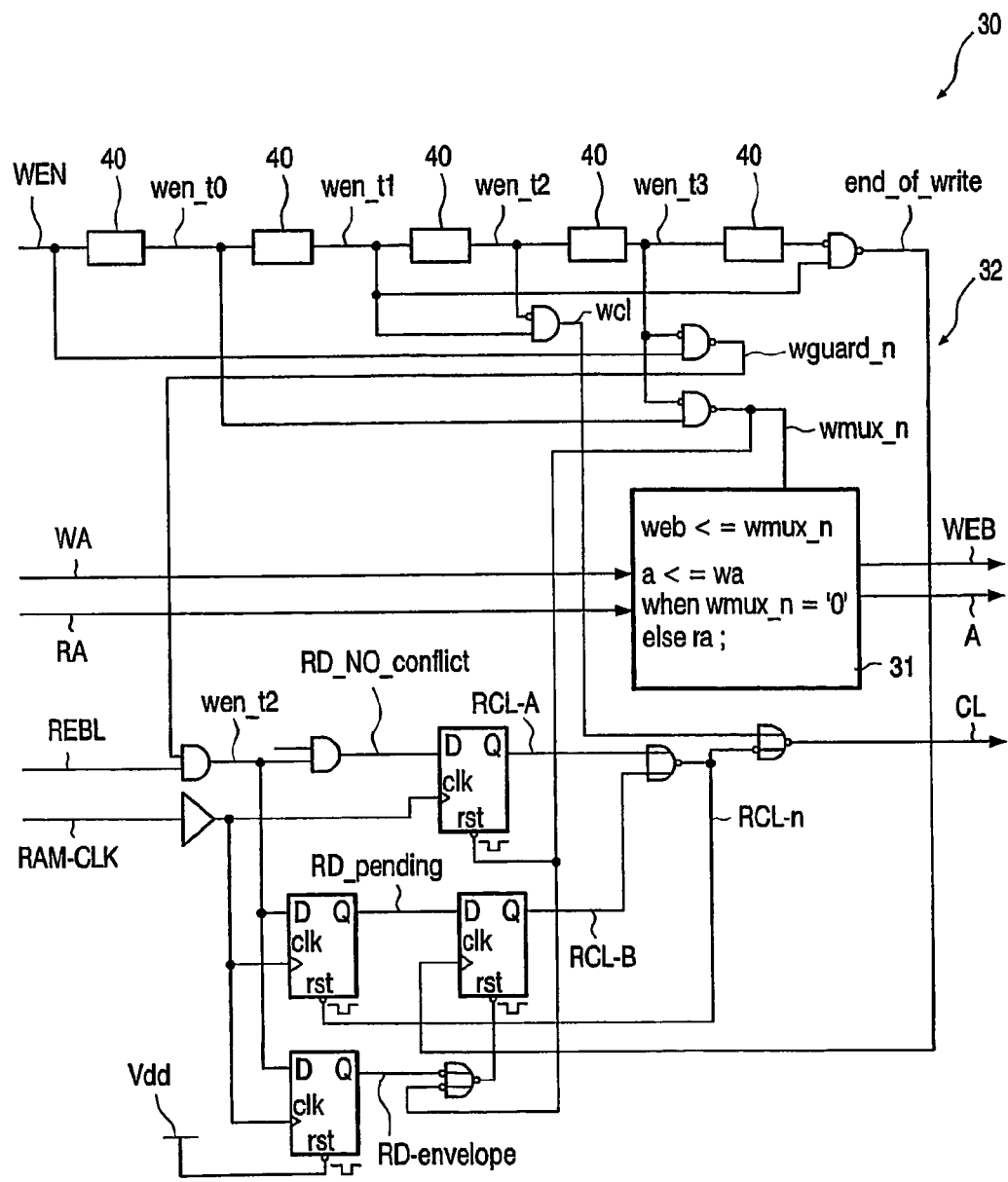
Figure 4:
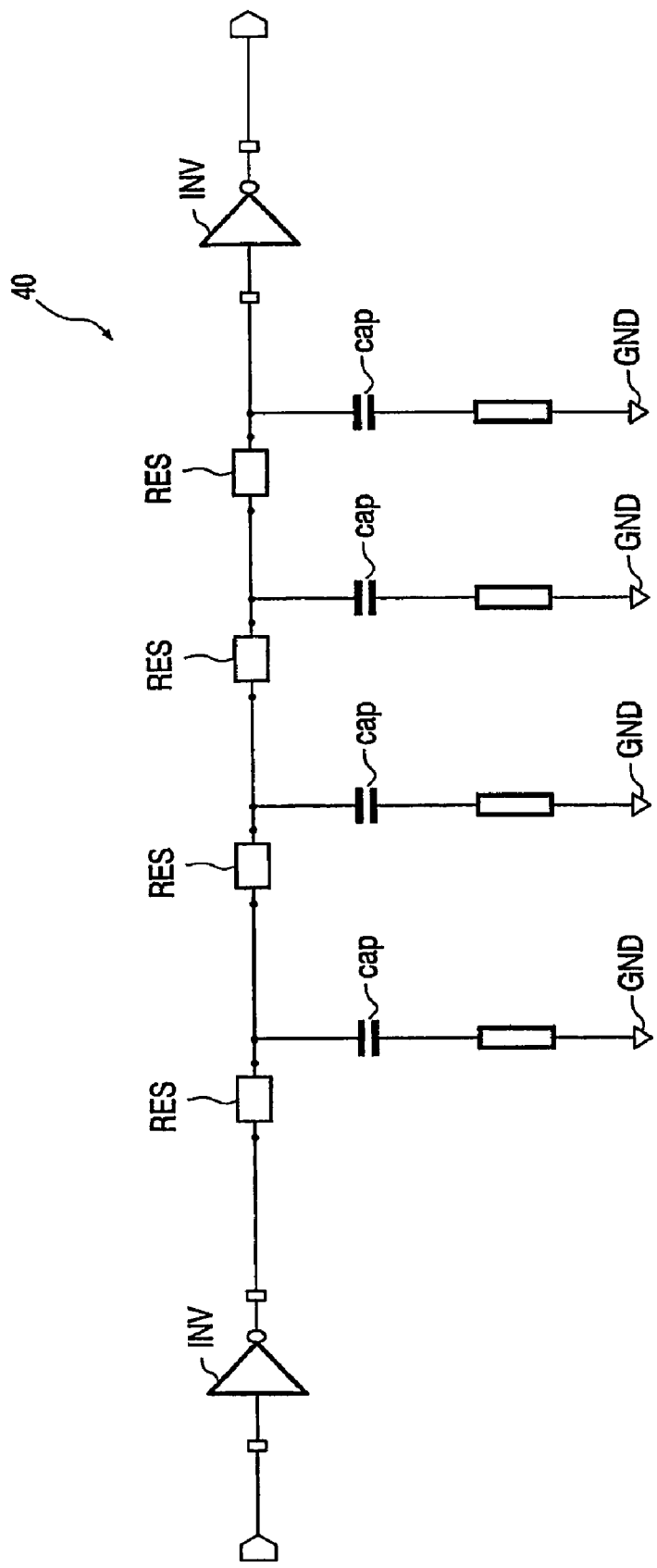

Preferred embodiments of the invention will now be described in a detailed description with reference to the accompanying drawings. These are meant to show examples to clarify the inventive concept in connection with the detailed description of preferred embodiment and in comparison to prior art. While there will be shown and described what is considered to be a preferred embodiment of the invention, it will of course be understood that various modifications and changes in form or in detail could readily be made without departing from the spirit of the invention. It is therefore intended that the invention may not be delimited to the exact form and detail herein shown and described nor to anything less than the whole of the invention herein disclosed and as herein after claimed. Further, the features described in the description, the drawings and the claims disclosing the invention, may be essential for the invention taken alone or in combination. The drawing shows in:

FIG. 1 a schematic diagram of the architecture of a preferred embodiment of the integrated circuit device;

FIG. 2 a simplified schematic flow diagram of a preferred embodiment of the method of performing access to a single-port memory device;

FIG. 3 a primitive block diagram of a preferred embodiment of the memory access device for performing controlled access to a signal port memory device, FIG. 4 a layout scheme of a preferred embodiment of a delay assembly for properly delaying a read-enable signal of high priority to generate an access-timing according to the demands of a memory device.

A preferred embodiment of an integrated circuit device 10 of FIG. 1 is used in an application specific integrated circuit (ASIC) 11 to support control of a display device 12. In particular, the integrated circuit device 10 comprises a number of single-port memory devices 13. In this embodiment, twenty-two single-port SRAMs 13 are comprised constituting a memory bank. The memory bank of SRAMs is used to perform a readout function 14 to readout data from the display device 12. Each one of the number of single-port SRAMs 13 is related to one of a number of twenty-two memory access devices 15, which are referred to as arbiters in the following. Generally, access 16a to each of the SRAMs 13 is provided for a read-signal 16 of low priority, pipelined by one of the arbiters 15 to one of the SRAMs 13. The request of a read-access is indicated by lines 16a. Read and write processes are not synchronized and use different clock rates, which are not synchronized. Access control therefore is performed by the arbiter bank of arbiters 15.

Such read-access 16a is pipelined by one or more of the arbiters 15 and executed by one or more of the SRAMs 13, except in the case, that an access 17a of a write-signal 17 is in preparation and/or in process. A write-access is indicated by lines 17a. As a direct access to one of the SRAMs 13 is always assigned to have high priority and therefore pipelined as a direct access to one of the SRAMs 13 by a respective arbiter 15, in the case a simultaneous read-access 16a of a read-signal 16 should happen to collide with a write-access 17a of a write-signal 17, the read-access 16a of a read-signal 16 is delayed and backed up. As the read-signal 16 is of low priority, as compared to the write-signal 17 being of high priority, the write-signal 17 of high priority is always provided with direct access either pipelined by an arbiter 15 to a respective SRAM 13 or also alternatively or additionally not pipelined by an arbiter 15, as indicated by lines 17b. The high priority of a write-access 17a, 17b of a write-signal 17 is indicated by the arrows on lines 17a and 17b, which arrows directly contact either the arbiter reference symbol 15 or the SRAM reference symbol 13. The low priority of a read-access 16a of a read-signal 16 is indicated in the figure by the gap between the read-access reference symbol 16a and the arbiter symbol 15.

An external timing controller 18, in particular a timing controller from customer side, is used to write pixel by pixel into a RAM 13 of the memory bank. The clock rate used for writing into the RAM in this particular embodiment has been set to about 5 MHz due to the application needed. Consequently, roughly every 200 ns a RAM write-access 17a, 17b is performed with the write-signal 17. The maximum writing frequency depends on temperature, voltage and the particular specifications of the acting process. Such process can be tuned to be slow, nominal of fast, dependent on delay elements, for instance RC-elements, suitable to delay an access to a RAM device 13. In particular, only one single external clock rate input interface 19 is provided for the ASIC 10.

Additionally, an internal timing controller 9, using a slower clock rate than the clock rate of the write process 17a, 17b, is capable to read out all SRAMs 13 of the memory bank. Thereby such read process is enabled to built up a whole line of a display 12. The read clock in this particular embodiment is tuned to 625 KHz.

As a read-access 16a of a read-signal 16 has low priority as compared to a write-access 17a, 17b of a write-signal, the point of time of the read-access depends on the particular moment, it is requested. If simultaneously to a read request 16a, a write request 17b, 17a occures, the write-signal 17 has always high priority and is provided with direct access to one of the SRAMs 13, either pipelined 17a by an arbiter 15 or not pipelined 17b by an arbiter 15.

Nevertheless, between two write-accesses 17a or 17b enough time is provided to complete a read-access 16a. As a rule of thumb, the inverse of the sum of the time to complete a read-access plus the RAM access time gives an upper limit for the write frequency which can be used in a process. The above numbers are only meant to give an example which has been realized for one particular embodiment. In principle the outlined scheme is applicable in any contemporary or future CMOS-technology having e.g. lower structure sizes of 350 nm, 250 nm or 180 nm. The clock rates may be chosen to be as high as necessary for the particular process. The clock rate may be higher if the process is faster whereas the clock rate may be lower if the process is slower. In principle a lower limit of the clock rate is set by the process demands while an upper limit is set by the power consumption.

In this particular embodiment, it is necessary to split a RAM bank into single SRAM devices 13 because it is not possible to have only one big RAM block due to the optimum floor plan of the display driver ASICs. Therefore, each SRAM device 13 needs one arbiter 15. This arbiter is placed best near the corresponding SRAM on the chip. Further, in this particular embodiment, the arbiters 15 do not differ from each other but each SRAM device 15 can be addressed separately.

In FIG. 2 a flow diagram indicates the steps of a preferred embodiment of the proposed method of performing access to a single-port memory device. Path A of an assembly of elements constituting a first path of the memory access device is indicated, where a read-signal is processed at a slow and preferably internal clock rate. If there is no read/write collision, a read clock signal rcl-a of reading is generated, in a multiplexer a respective read address is multiplexed and thereafter, a read-access is performed to the single-port memory device. The slow clock rate is indicated by the double dashed line.

However, if there is a read/write collision, a write-signal of a write-access is always provided with high priority, whereas the read-access of a read-signal is provided with low priority. Therefore, a write clock signal wcl is generated now for writing and with proper delay to generate an access-timing according to the demands of the memory device. A corresponding writing address is multiplexed and the write-access is executed to the memory device. Writing is processed with the fast preferably external clock rate along a separate path, indicated by the single dashed line.

Also meanwhile a read clock signal rcl-b to be processed along a path B is generated for reading and buffered by suitable elements. In particular, a read-pending and a read-envelope signal is generated. As soon as the write-access of wcl is completed along the separate oath in a first path assembly, with completion of the write-access a read-access is introduced along path B and finally finished. Signal processing along path B is performed at the flow, preferably internal, clock rate indicated by the double dashed line.

In FIG. 3, a preferred embodiment 30 of a memory access device is shown in a simplified layout, adapted to execute the method as described above in the preferred embodiment outlined in connection with FIGS. 1 and 2.

The memory access device 30 uses the following input signals: a read address RA and a write address WA, a read-enable signal REBL at a slow, preferably internal clock RAM-CLK. This may be any clock on the same chip on which the arbiter is also located on. Further a write-enable signal WEN is provided. Specifications of the input signals are provided in table 1 below. As a clock, an oscillator or a gate between two clocks or a phase locked loop (PLL) detecting the phase between two clocks may be used.

TABLE 1

| NAME | FROM | ACTION | DESCRIPTION |
|---|---|---|---|
| WEN | add_p1_gen08 | Rising | Write strobe (rising edge triggers write pulse) |
| REBL | add_p2_gen07 | 1 | read-enable (is high during one ram_clk cycle) |
| RA | add_p2_gen07 | | read address |
| WA | add_p1_gen07 | | Write address |
| OSC_CLK | oscillator | Rising | clock |

The arbiter is configured with two paths, a path A and a path B.

Path A is used if there is no write collision at the beginning of a read-access. The read-signal of path A may have a duration of up to one cycle of the slow, preferably internal, clock rate. However, this duration is shortened if a write-access occurs. Generally, in case of no collision, the rising edge of the read clock signal RCL-A is generated. As outlined with FIG. 2 already, the read address RA is multiplexed internally to the read address A of the RAM as outlined in table 2 below.

Path B is used only, if there is a write collision at the beginning of a read process.

The arbiter gives the write-access a higher priority. If during the begin of a read-access a write-access occurs, then the read-access will be stored in path B. As outlined in FIG. 2, when the write-access is finished, then the read-access is indicated. In this case, the read clock signal RCL-B is processed with the slow, preferably internal, clock rate RAM-CLK.

Path A and path B for read-signals and the separate path for write signals are constituted by a number of logic gates and flip-flops as indicated in FIG. 3. In particular, a number of flip-flops and gates constitute a path B assembly. In such a path B assembly, a RD-envelope signal is generated as a reset signal to set the RAM trigger back to low, if a write-access happens. Such RAM trigger is usually provided by the clock rate of the slow, preferably internal, RAM-CLK signal. The write-access is conducted by the write-enable signal WEN through a proper choice of delay elements 40 to the memory bank. A list of output signals with specification is provided in table 2 below.

TABLE 2

| NAME | TO | ACTION | DESCRIPTION |
|---|---|---|---|
| WEB | RAM | | 0 = write, 1 = read |
| CL | RAM | rising | triggers the ram |
| A | RAM | | addresses the ram |

In particular, a read/write indicating signal WEB, a RAM trigger CL and a RAM-address signal A is provided as an output of the arbiter.

After completing of the write access, the RCL-B signal can go high with the end-of-write rising edge of an end-of-write signal. This means, that the end of the write-access introduces a read-access. However, in case the read-access processes already, the RD-pending signal has been set low by the RCL-n signal provided from the RCL-B high level of a previous read-access.

The arbiter of FIG. 3 and the respective control process has been tested under a variety of conditions. In particular, the supply voltage, the temperature, a low level and a high level input voltage have been tested to demonstrate the performance of the arbiter. The specifications of the parameters are indicated in table 3 below.

TABLE 3

| SYMBOL | PARAMETER | CONDITIONS | MIN. | TYP. | MAX. | UNIT |
|---|---|---|---|---|---|---|
| $V_{DD1}$ | Supply voltage | Reference: $V_{SS1}$ | 1.7 | 3.3 | 3.6 | V |
| | | | 0.7 | 1.5 | 1.7 | |
| Tamb | Temperature | | −40 | 27 | 125 | ° C. |
| $V_{IL}$ | low level input voltage | | $V_{SS}$ | — | 0.2 $V_{DD1}$ | V |
| $V_{IH}$ | high level input voltage | | 0.8 $V_{DD1}$ | — | $V_{DD1}$ | V |

The arbiter may be operated also with parameters different from those indicated in Table 3. The parameters of operation may be selected dependent on technology, supplier or application. In particular, the supply voltage value may be varied in the range indicated by the upper and lower line of the first row in Table 3. Also the supply voltage may exceed the indicated values. E.g. a maximum voltage may clearly be chosen to be 5V or higher.

In FIG. 4, an advantageous chain of RC-elements is indicated, to be used for delay of write-enable signal in a delay-element 40 of FIG. 3 due to the smaller areas as compared to the buffer chain. Additionally or alternatively to a RC-element chain, also buffer chains can be used to generate a proper internal signal adapted for RAM accessing by delaying a write-enable signal. In particular, the RC-element chain contains a number of resistance RES and capacity elements, one pole thereof being set on ground voltage GND. By such a chain the steepness of the rising edge of an input signal is flattened out, so that a threshold voltage is reached at a later point of time. A proper threshold voltage may be e.g. 0.7 volts but may be also any value, preferably as indicated by the range of Table 3. Thereby, a proper delay of the write-enable signal WEN is achieved. To generate a defined slope of the rising edge at the beginning and the end of the chain of RC elements, an inverter INV is used.

In summary in the performed embodiment an arbiter 15 for accessing a single-port RAM 13 without the need to use a handshaking protocol is proposed. This allows simultaneous read and write accesses to a single-port RAM 13. All write accesses are delayed so that the arbiter 15 can detect, if there is a simultaneous read. If there is a read, the read is delayed until the write is complete.

The invention claimed is:

1. Method of performing access to a single-port memory device, the method comprising the steps of:
    providing a memory access device to control the access,
    processing a first access-signal (WEN) of high priority at a first clock rate,
    processing a second access-signal (REBL) of low priority at a second clock rate,
    wherein the first clock rate exceeds the second clock rate,
    providing direct access to the memory device for the first access-signal (WEN) of high priority, and
    properly delaying the first access-signal (WEN) of high priority to generate an access-timing according to the demands of the memory device.

2. Method according to claim 1, characterized in that access to the memory device for the second access-signal (REBL) of low priority is generally provided, except in the case that an access of a first access-signal (WEN) of high priority is in preparation and/or in process, to guarantee direct access to the memory device for the first access-signal (WEN) of high priority.

3. Method according to claim 1, characterized in that in the case that access to the memory device is not provided for the second access-signal (REBL) of low priority, the second access-signal (REBL) is backed up.

4. Method according to one of claim 1, characterized in that in the case that access to the memory device is not provided for the second access-signal (REBL) of low priority, direct access to the memory device is made by the first access-signal (WEN) of high priority and/or after completion of an access to the memory device by the first access-signal (WEN) of high priority access is made by the second access-signal of low priority.

5. Method according to claim 4, characterized in that the completion of the access made by the first access-signal (WEN) of high priority is used to introduce the access of the second access-signal (REBL) of low priority.

6. Method according to one of claim 1, characterized in that the proper delay of the first access-signal (WEN) of high priority is available from a number of delay periods ($t_0$, $t_1$, $t_2$, $t_3$) offered for choice to generate an access-timing according to the demands of the memory device.

7. Method according to one of claim 1, characterized in that a time gap in between two subsequent accesses of first access-signals (WEN) of high priority is sufficiently wide to complete an access of a second access-signal of low priority (REBL) therein.

8. Method according to one of claim 1, characterized in that the first access-signal (WEN) of high priority is a write-signal (WEN), in particular a write-enable signal (WEN) and/or the second access-signal (REBL) of low priority is a read-signal (REBL), in particular a read-enable signal (REBL).

9. Method according to one of the claim 1, characterized in that the first clock rate is an external clock rate of the memory access device and/or the second clock rate is an internal clock rate (RAM-CLK) of the memory access device.

10. Memory access device for performing controlled access to a single-port memory device, comprising:
    a first path for processing a first access-signal (WEN) of high priority at a first clock rate,
    a second path for processing a second access-signal (REBL) of low priority at a second clock rate, wherein the first clock rate exceeds the second clock rate,
    a control-assembly for providing direct access to the memory device for the first access-signal (WEN) of high priority,
    a delay-assembly for properly delaying ($t_0$, $t_1$, $t_2$, $t_3$) the first access-signal (WEN) of high priority adapted to generate an access-timing according to the demands of the memory device.

11. Memory access device according to claim 10, characterized in that the first and/or second path comprises a number of control elements, in particular a logic gate and/or a flip-flop, functionally connected with each other and an input-interface and an output-interface.

12. Memory access device according to claim 10, characterized in that at least the second path comprises a storage element to perform a back-up function.

13. Memory access device according to one of the claim 10, characterized in that the control-assembly comprises at least one input-interface delay-assembly-signal and/or access-addresses and an output-interfaces to transmit an address-signal and/or a RAM-select signal.

14. Memory access device according to one of claim 10, characterized in that the delay-assembly comprises a number of resistance-capacitor elements and/or buffer elements, in particular a chain thereof.

15. Memory access device according to one of claim 10, characterized by a single external clock-rate input.

16. Integrated circuit device comprising:
    a single-port memory device,
    a means for supplying a first clock rate,
    a single external-clock-rate input for supplying a second clock rate, and
    a memory access device of one of the claims 10 for accessing the single-port memory device.

17. Integrated circuit device according to claim 16, wherein the means for supplying a first clock rate comprises an internal timing controller.

18. Integrated circuit device according to claim 16, characterized by comprising a number of single-port memory devices, each one of the number of single-port memory devices being addressable separately and/or a number of memory access devices each one of the number of single-port memory devices being related to one of the number of memory access devices, wherein in particular the number of memory access devices are identical to each other.

19. Method of use of an integrated circuit device, in particular of an integrated circuit device as claimed in claim 16, as an application specific integrated circuit device, in particular for accessing a display device, in particular for use with regard to a display driver.

* * * * *